United States Patent
Ohba et al.

(10) Patent No.: US 7,911,254 B2
(45) Date of Patent: Mar. 22, 2011

(54) OFFSET CORRECTION DEVICE AND METHOD

(75) Inventors: Takeshi Ohba, Kawasaki (JP); Hideharu Shako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 67 days.

(21) Appl. No.: 12/538,321

(22) Filed: Aug. 10, 2009

(65) Prior Publication Data

US 2010/0039158 A1 Feb. 18, 2010

(30) Foreign Application Priority Data

Aug. 12, 2008 (JP) ................................. 2008-208204

(51) Int. Cl.
*H03L 5/00* (2006.01)
(52) U.S. Cl. ............................. 327/307; 330/9; 375/319
(58) Field of Classification Search .................. 327/307; 330/9; 375/319
See application file for complete search history.

(56) References Cited

U.S. PATENT DOCUMENTS

| | | | |
|---|---|---|---|
| 5,903,823 A | 5/1999 | Moriyama et al. | |
| 6,081,698 A | 6/2000 | Moriyama et al. | |
| 6,091,941 A | 7/2000 | Moriyama et al. | |
| 6,560,447 B2 * | 5/2003 | Rahman et al. | 455/232.1 |
| 6,801,581 B1 * | 10/2004 | Francos et al. | 375/296 |
| 7,505,744 B1 * | 3/2009 | Shan | 455/130 |
| 7,561,864 B2 * | 7/2009 | Maalouli et al. | 455/286 |
| 2007/0110183 A1 | 5/2007 | Nagatani et al. | |

FOREIGN PATENT DOCUMENTS

| | | |
|---|---|---|
| JP | 9-83587 | 3/1997 |
| WO | 2005/025168 | 3/2005 |

* cited by examiner

*Primary Examiner* — Kenneth B. Wells
(74) *Attorney, Agent, or Firm* — Katten Muchin Rosenman LLP (57) ABSTRACT

A direct-current-offset correction device includes a digital-to-analog converter that converts a digital signal into an analog signal, a modulator that modulates the analog signal to generate a modulated signal, a direct-current-offset correction value calculation unit that calculates a direct-current-offset correction value as a reverse characteristic component of a carrier leak occurring in the modulated signal based on a demodulated signal which is demodulated by feeding back the modulated signal, a direct-current-offset correction unit that corrects a direct-current-offset on the digital signal based on the direct-current-offset correction value, a correction value detection unit that detects whether or not the direct-current-offset correction value is zero or a neighboring value of zero, and an offset generation unit that superimposes a direct-current-offset component on the analog signal based on a detection result of the correction value detection unit.

6 Claims, 11 Drawing Sheets

OFFSET CORRECTION DEVICE AND METHOD

CROSS-REFERENCE TO RELATED APPLICATIONS

This application is based upon and claims the benefit of priority of the prior Japanese Patent Application No. 2008-208204, filed on Aug. 12, 2008, the entire contents of which are incorporated herein by reference.

FIELD

The present invention relates to a technique for correcting a direct-current offset that occurs in a quadrature modulator or the like which is provided in a radio transmitting device of a base station or the like.

BACKGROUND

Generally, a direct-current (DC) offset occurs in a quadrature modulator or the like in a radio transmitting apparatus using direct radio frequency (RF) modulation that is used in a base station or the like. The DC offset makes a carrier leakage occur. The carrier leakage makes a quadrature modulation accuracy of a transmitting apparatus lower or makes a bit error rate of a receiving apparatus higher. The carrier leakage exerts a negative influence to adjacent bands in a wideband code division multiple access (W-CDMA) radio system.

Examples of a technique for correcting a DC offset include the following techniques (for example, see Japanese Laid-Open Patent Publication No. 09-83587 and International Publication Pamphlet No. WO2005/025168): (1) a technique in which a transmission signal is received with a feedback loop that is provided in a transmitter to obtain a feedback signal, in which a DC-offset component is extracted from only the received feedback signal, and in which a DC offset is corrected by a transmitting unit (a feedback (FB)-type DC-offset correction method or a feedback-signal-integral-type DC offset correction method); and (2) a technique in which a DC-offset component is extracted from the difference between the above-mentioned feedback signal and the transmission signal (a reference signal), and in which a DC offset is corrected by the transmitting unit (a reference-type DC-offset correction method or a signal-comparison-type DC offset correction method).

Figure 7A:
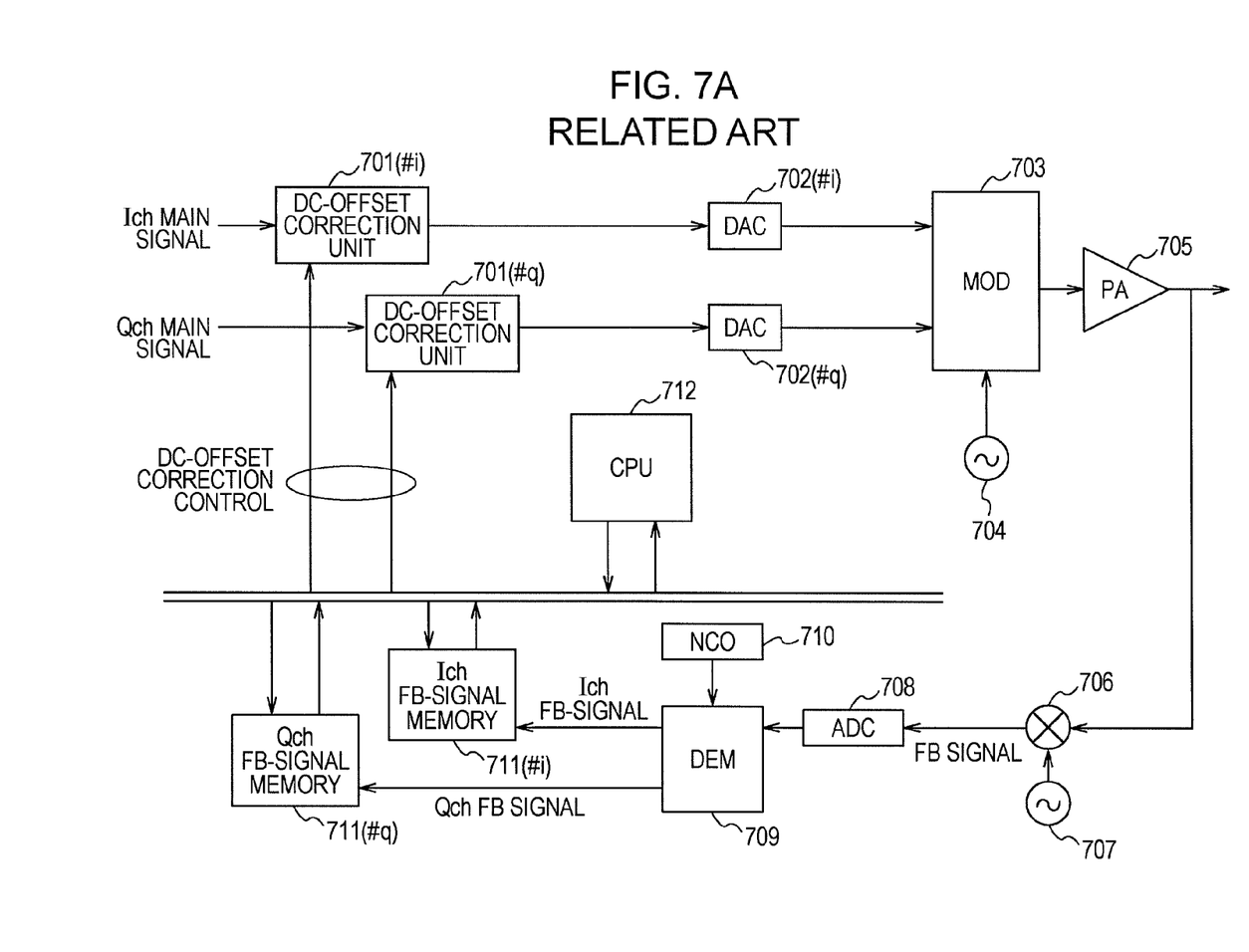
FIGS. 7A and 7B are diagrams of a configuration of the related art.

FIG. 7A is a diagram of a configuration of the related art.

A digital main transmission signal for an I channel that is used for an in-phase component and a digital main transmission signal for a Q channel that is used for a quadrature component, which are baseband signals to be transmitted, are input to DC-offset correction units 701 (#i) and 701 (#q), respectively. Output signals from the DC-offset correction units 701 (#i) and 701 (#q) are input to digital-to-analog converters (DACs) 702 (#i) and 702 (#q), respectively, to be converted into an analog main transmission signal for the I channel and an analog main transmission signal for the Q channel, which are baseband signals. The analog main transmission signal for I channel and the analog main transmission signal for Q channel are input to a quadrature modulator (MOD) 703.

The MOD 703 performs, on the basis of the analog main transmission signal for the I channel and the analog main transmission signal for the Q channel that are input from the DACs 702 (#i) and 702 (#q), respectively, quadrature modulation on a reference carrier wave that is output from an oscillator 704, thereby generating a transmission modulated signal.

Power amplification is performed on the transmission modulated signal by a power amplifier (PA) 705, and then, the transmission modulated signal is output to a transmitting-antenna feeding unit (not illustrated). Furthermore, the transmission modulated signal is input as a branch signal to a feedback system including units 706 to 711 by a directional coupler (not illustrated) or the like.

Frequency conversion is performed by a frequency conversion unit 706 on the branch signal using an oscillation signal that is output from an oscillator 707, thereby converting the frequency of the branch signal into an intermediate frequency or a baseband frequency.

The branch signal that was subjected to frequency conversion is converted into a digital signal by an analog-to-digital converter (ADC) 708. The digital signal that is obtained by conversion is converted into a feedback baseband signal for the I channel and a feedback baseband signal for the Q channel by a demodulator (DEM) 709 which operates on the basis of a signal that is output from a numerically controlled oscillator (NCO) 710.

The feedback baseband signal for the I channel and the feedback baseband signal for the Q channel are stored in an I-channel feedback-signal memory 711 (#i) and a Q-channel feedback-signal memory 711 (#q), respectively.

For example, in the above-mentioned technique (2), a central processing unit (CPU) 712 compares the feedback baseband signal for the I channel and the feedback baseband signal for the Q channel, which are stored in the I-channel feedback-signal memory 711 (#i) and the Q-channel feedback-signal memory 711 (#q), with a main transmission signal for the I channel and a main transmission signal for the Q channel, respectively, thereby detecting a carrier leakage that occurs in the DACs 702 (#i) and 702 (#q), the MOD 703, or the like. The CPU 712 calculates inverse components of the detected carrier leakage as a DC-offset correction value for the I channel and a DC-offset correction value for the Q channel. The CPU 712 inputs the DC-offset correction value for the I channel and the DC-offset correction value for the Q channel to the DC-offset correction units 701 (#i) and 701 (#q), respectively.

Figure 7B:
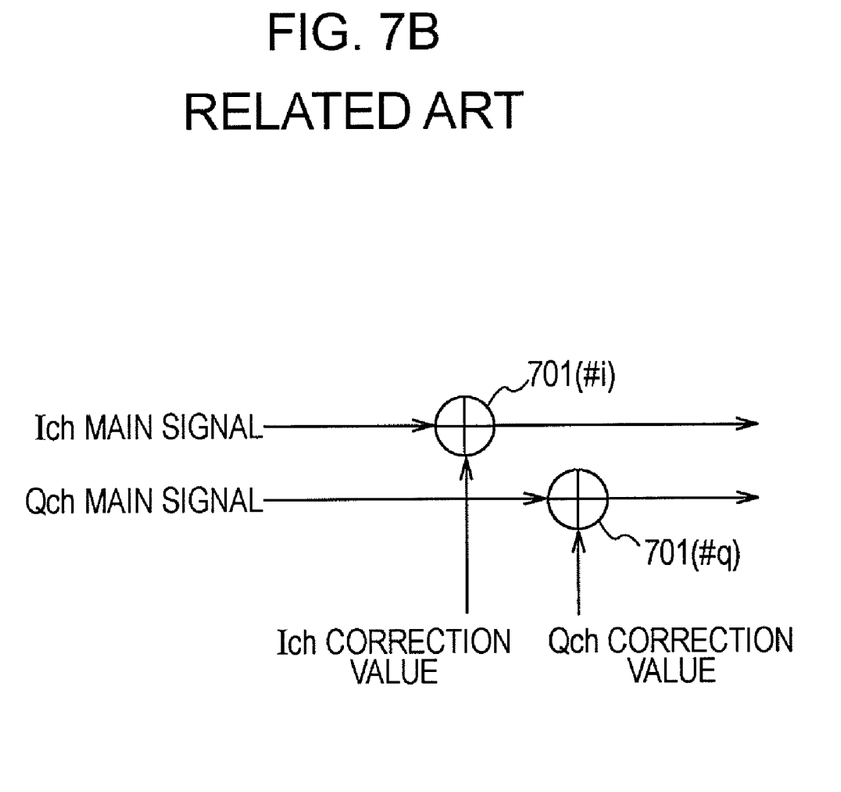

As illustrated in FIG. 7B, the DC-offset correction units 701 (#i) and 701 (#q) add the DC-offset correction value for the I channel and the DC-offset correction value for the Q channel to the main transmission signal for the I channel and the main transmission signal for the Q channel, respectively. The DC-offset correction units 701 (#i) and 701 (#q) output the main transmission signal for the I channel and the main transmission signal for the Q channel to the DAC 702 (#i) for the I channel and the DAC 702 (#q) for the Q channel, respectively.

As a result of the above-mentioned operation, carrier leakage comes not to be output in the output of PA 705.

In a configuration that is illustrated in FIGS. 7A and 7B, a DC-offset correction process that is performed by the DC-offset correction units 701 (#i) and 701 (#q) is performed in order to correct a carrier-leakage component that appears in a modulation frequency. However, there is a case in which an input signal having a amplitude of zero is input to a transmitting apparatus.

In this case, because the amplitude of the input signal is zero, it is difficult to calculate a phase difference from the difference between a feedback signal and a transmission signal. Thus, it is preferable that the DC-offset correction process be performed using the above-mentioned technique (1).

Furthermore, typically, it is difficult for the DAC 702 (#i) or 702 (#q), which are illustrated in FIG. 7A, to maintain complete linearity. As denoted by reference numeral 801 in FIG. 8, all output bits change at a point at which the value of an input signal changes from −1 to zero. Accordingly, a phenomenon in which an output changes by a large amount generally occurs at the point.

Characteristics associated with this phenomenon are stipulated as differential nonlinearity (DNL) characteristics, integral nonlinearity (INL) characteristics of a DAC, and so forth.

Figure 9:
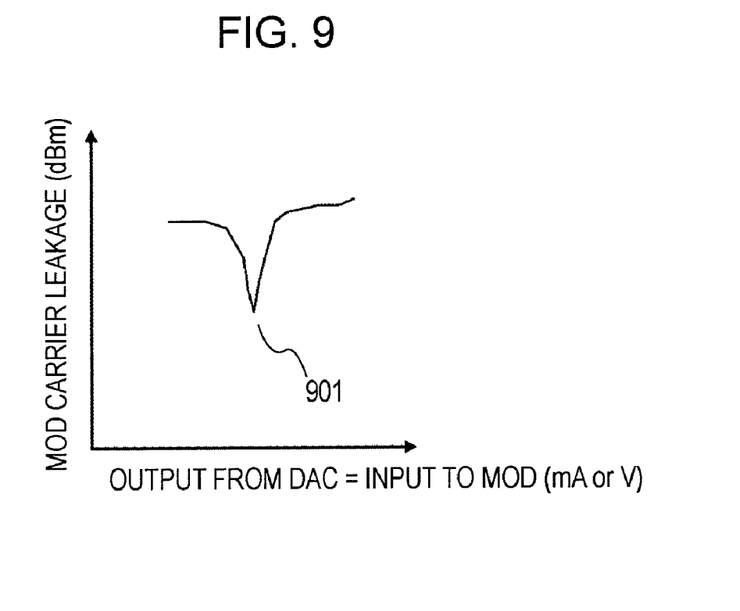
FIG. 9 is a graph illustrating the relationships between output from the DAC and carrier-leakage characteristics.

Additionally, regarding carrier-leakage characteristics in the MOD 703 illustrated in FIG. 7A, an optimum point (denoted by reference numeral 901 in FIG. 9) of the carrier-leakage characteristics changes for an input to the MOD 703 (an output from the DAC 702 (#i) or 702 (#q)) in accordance with the balance between the I channel side and the Q channel side as illustrated in FIG. 9.

Figure 8:
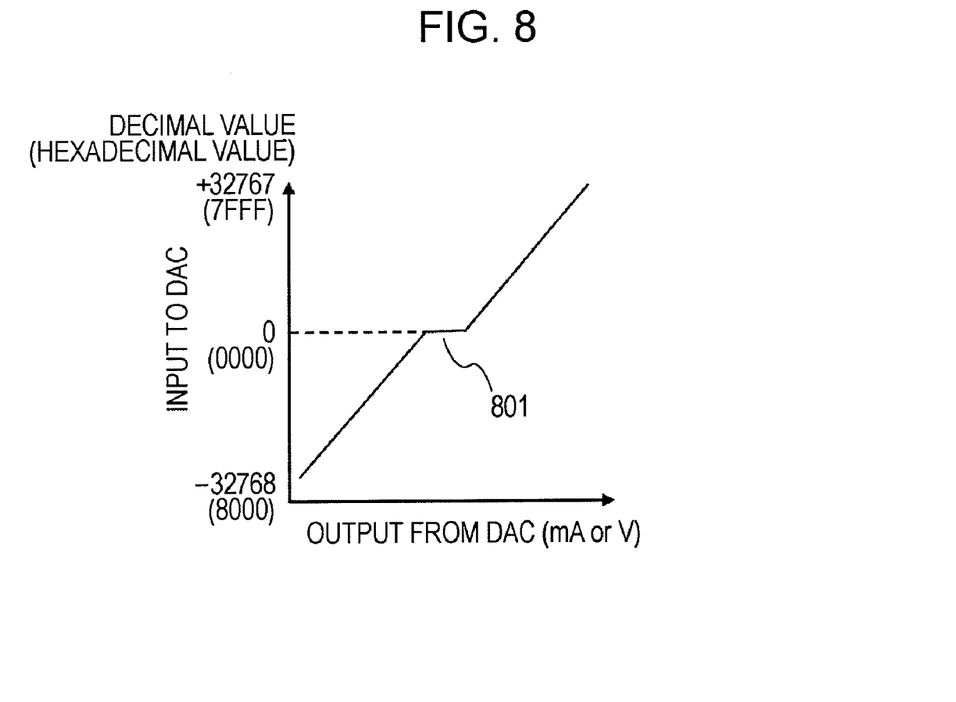
FIG. 8 is depicts non-linear characteristics of a DAC.
Figure 10:
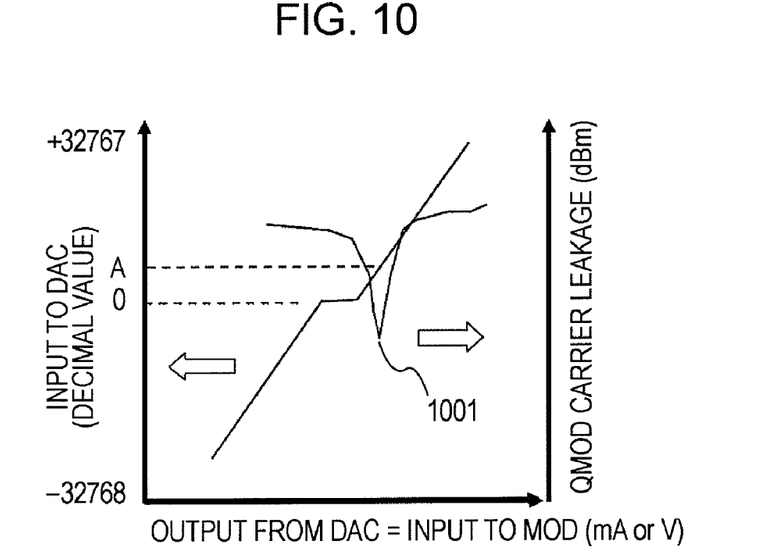
FIG. 10 is a graph illustrating the relationships between input to the DAC and output from the DAC and carrier-leakage characteristics.

Accordingly, using the relationships illustrated in FIGS. 8 and 9, the relationships between input signal that is input to the DAC 702 (#i) or 702 (#q) and carrier leakage are obtained as illustrated in FIG. 10.

The relative positional relationships between the input-output characteristics of the DAC 702 (#i) or 702 (#q) and the carrier-leakage characteristics in the MOD 703 or the like differ depending on a variation in production of elements constituting the DAC 702 (#i) or 702 (#q), the MOD 703, or the like, and are not easily predicted.

For example, when the positional relationships between the input-output characteristics of the DAC 702 (#i) or 702 (#q) and the carrier-leakage characteristics in the MOD 703 or the like are obtained as illustrated in FIG. 10, a value A can be calculated as an input to a DAC for an optimum point 1001 of the carrier-leakage characteristics. In this case, correction is performed by the DC-offset correction unit 701 (#i) or 701 (#q) illustrated in FIG. 7A so that an amplitude which is calculated as a DC-offset correction value is set to the value A, whereby the value of carrier leakage can be made to approach the optimum point 1001.

Figure 11:
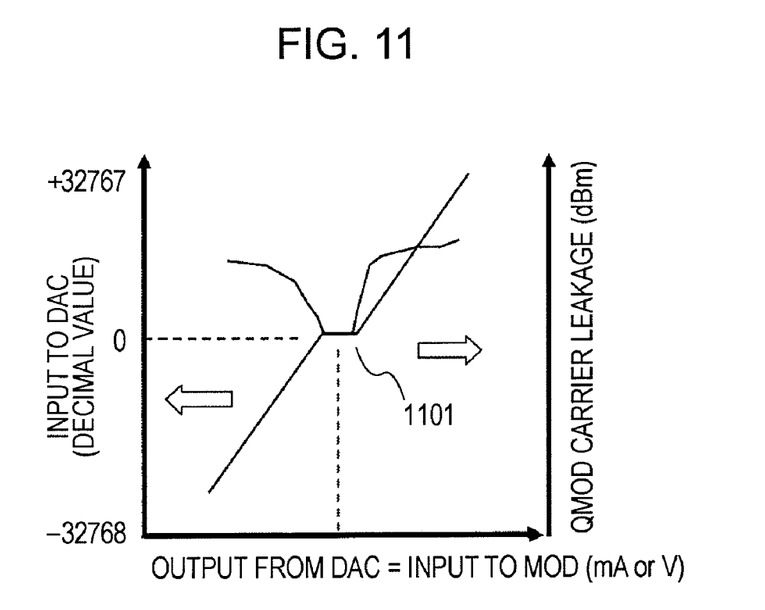
FIG. 11 is a graph illustrating the relationships between input to the DAC and output from the DAC, and carrier-leakage characteristics in a case in which the optimum point of the carrier-leakage characteristics is positioned near a point at which the value of an input to the DAC is zero.

However, for example, as illustrated in FIG. 11, regarding the relative positional relationships between the input-output characteristics of the DAC 702 (#i) or 702 (#q) and the carrier-leakage characteristics in the MOD 703 or the like, in a case in which an optimum point 1101 of the carrier-leakage characteristics is positioned near a point at which the value of an input to a DAC is zero, even when DC-offset correction is performed and a DC-offset correction value is calculated as a result, the DC-offset correction value becomes zero. In other words, there is a case in which the value of carrier leakage that occurs when DC-offset correction is performed is equal to the value of carrier leakage that occurs when DC-offset correction is not performed. Accordingly, the value of carrier leakage cannot be made to approach the minimum point as illustrated in FIG. 11, and the related art has a problem that carrier leakage may not be reduced.

Consequently, the related art has a problem that the performance of a transmitting device largely depends on individual differences among DACs or MODs that occur in production.

SUMMARY

According to an aspect of the invention, a direct-current-offset correction device includes a digital-to-analog converter that converts a digital signal into an analog signal, a modulator that modulates the analog signal to generate a modulated signal, a direct-current-offset correction value calculation unit that calculates a direct-current-offset correction value as a reverse characteristic component of a carrier leak occurring in the modulated signal based on a demodulated signal which is demodulated by feeding back the modulated signal, a direct-current-offset correction unit that corrects a direct-current-offset the digital signal based on the direct-current-offset correction value, a correction value detection unit that detects whether or not the direct-current-offset correction value is zero or a neighboring value of zero, and an offset generation unit that superimposes a direct-current-offset component on the analog signal based on a detection result of the correction value detection unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE PREFERRED EMBODIMENTS

Embodiments will be described below in detail with reference to the accompanying drawings.

Figure 1A:
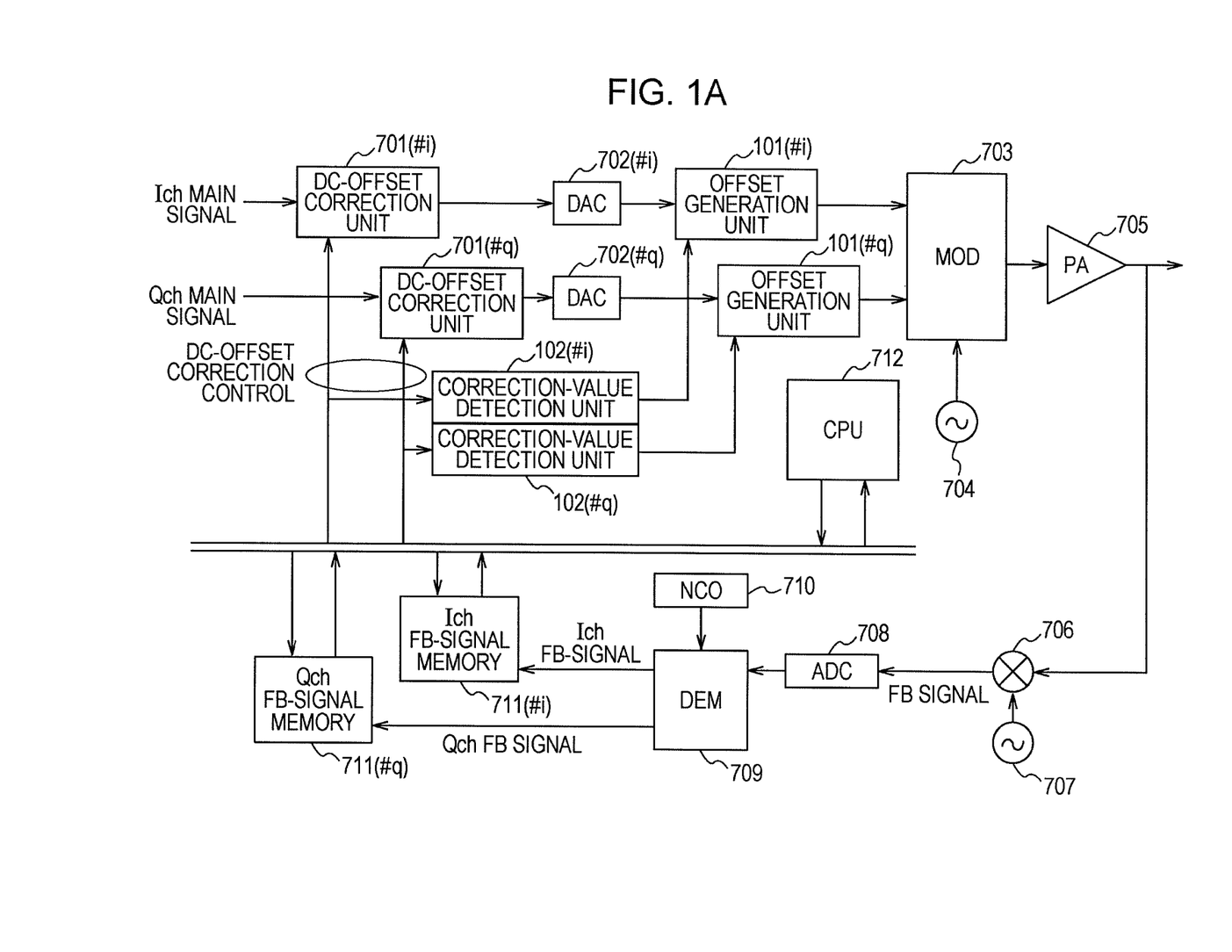
FIGS. 1A and 1B are diagrams of a configuration of a first embodiment.

FIG. 1A is a diagram of a configuration of a first embodiment.

In FIG. 1A, elements that are denoted by reference numerals which are the same as reference numerals that denote elements in the configuration of the related art illustrated in FIG. 7A perform processes that are substantially the same as processes performed by the elements illustrated in FIG. 7A.

The configuration of the first embodiment illustrated in FIG. 1A is different from the configuration of the related art illustrated in FIG. 7A in that, for each of the I and Q channels, when a DC-offset correction value that is calculated in the DC-offset correction process, which is performed by the CPU 712 in a normal case, becomes zero or a value close to zero, a DC-offset component is generated and forcefully superimposed, thereby reducing carrier leakage.

For example, correction-value detection units 102 (#i) and 102 (#q) monitor a DC-offset correction value for the I channel used for an in-phase component and a DC-offset correction value for the Q channel used for a quadrature component that are supplied from the CPU 712 to the DC-offset correction units 701 (#i) and 701 (#q), respectively. Then, when the DC-offset correction value for the I channel and the DC-offset correction value for the Q channel become zero or values close to zero, DC-offset components are forcefully superimposed on analog outputs from the DACs 702 (#i) and 702 (#q) by offset generation units 101 (#i) and 101 (#q) that are disposed at the subsequent stages to the DACs 702 (#i) and 702 (#q), respectively.

Figure 2:
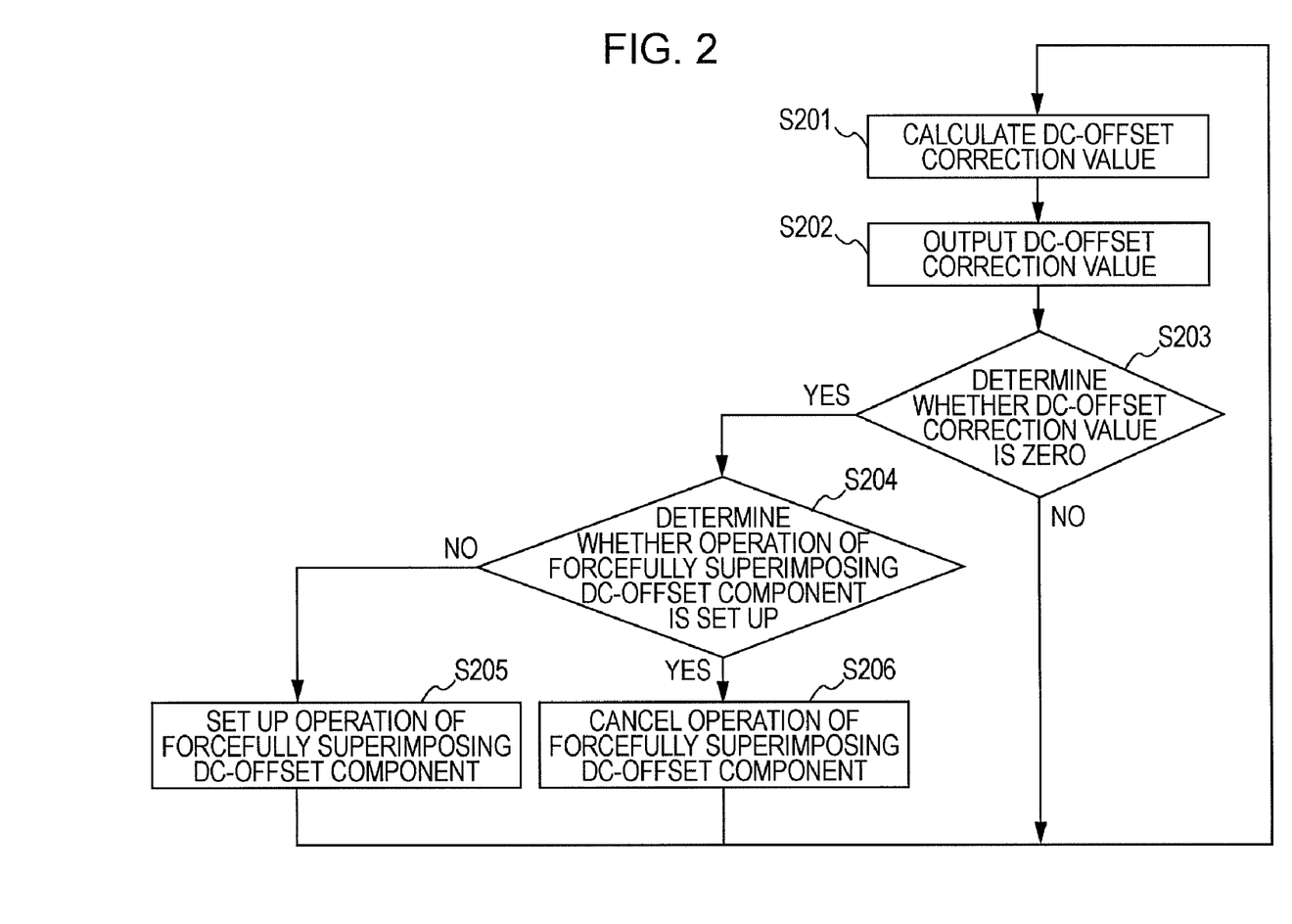
FIG. 2 is a flowchart illustrating operations of a CPU 712 and correction-value detection units 102 (#i) and 102 (#q)

FIG. 2 is a flowchart illustrating operations of the CPU 712, and the correction-value detection units 102 (#i) and 102 (#q) that are illustrated in FIG. 1A.

The CPU 712 compares, separately for the I channel and for the Q channel, the feedback baseband signal for the I channel and the feedback baseband signal for the Q channel, which are stored in the I-channel feedback-signal memory 711 (#i) and the Q-channel feedback-signal memory 711 (#q), with the main transmission signal for the I channel and the main transmission signal for the Q channel, respectively, thereby detecting a carrier leakage that occurs in the DACs 702 (#i) and 702 (#q), the MOD 703, or the like. The CPU 712 calculates inverse components of the detected carrier leakage as a DC-offset correction value for the I channel and a DC-offset correction value for the Q channel (step S201).

The CPU 712 outputs the DC-offset correction value for the I channel and the DC-offset correction value for the Q channel, which are calculated separately for the I channel and for the Q channel, to the DC-offset correction units 701 (#i) and 701 (#q), respectively, via a bus (step S202).

The correction-value detection units 102 (#i) and 102 (#q) determine whether or not the DC-offset correction value for the I channel and the DC-offset correction value for the Q channel that are supplied from the CPU 712 to the DC-offset correction units 701 (#i) and 701 (#q), respectively, are zero or values close to zero (step S203).

When the DC-offset correction value for the I channel and the DC-offset correction value for the Q channel that are supplied from the CPU 712 to the DC-offset correction units 701 (#i) and 701 (#q), respectively, are not zero or not values close to zero, i.e., when a result of determination performed by each of the correction-value detection units 102 (#i) and 102 (#q) in step S203 is NO, the correction-value detection units 102 (#i) and 102 (#q) do not cause the offset generation units 101 (#i) and 101 (#q) to superimpose DC-offset components on the analog outputs from the DACs 702 (#i) and 702 (#q). The CPU 712 continues the process of calculating DC-offset correction values (step S201 when a determination result is NO in step S203).

In contrast, when either of or both of the DC-offset correction value for the I channel and the DC-offset correction value for the Q channel that are supplied from the CPU 712 to the DC-offset correction units 701 (#i) and 701 (#q), respectively, are zero or values close to zero, either of or both of a result of determination performed by the correction-value detection unit 102 (#i) and a result of determination performed by the correction-value detection unit 102 (#q) are YES in step S203. In this case, either the correction-value detection unit 102 (#i) determines whether or not the offset generation unit 101 (#i) is superimposing a DC-offset component on the analog output from the DAC 702 (#i), or the correction-value detection unit 102 (#q) determines whether or not the offset generation unit 101 (#q) is superimposing a DC-offset component on the analog output from the DAC 702 (#q). Alternatively, the correction-value detection units 102 (#i) and 102 (#q) determine whether or not the offset generation units 101 (#i) and 101 (#q) are superimposing DC-offset components on the analog outputs from the DACs 702 (#i) and 702 (#q), respectively (step S204 when a determination result is YES in step S203).

Either, when the correction-value detection unit 102 (#i) determines that the offset generation unit 101 (#i) is not superimposing a DC-offset component on the analog output from the DAC 702 (#i), the correction-value detection unit 102 (#i) sets up, for the offset generation unit 101 (#i), an operation of forcefully superimposing a DC-offset component on the analog output from the DAC 702 (#i), or, when the correction-value detection unit 102 (#q) determines that the offset generation unit 101 (#q) is not superimposing a DC-offset component on the analog output from the DAC 702 (#q), the correction-value detection unit 102 (#q) sets up, for the offset generation unit 101 (#q), an operation of forcefully superimposing a DC-offset component on the analog output from the DAC 702 (#q). Alternatively, when the correction-value detection units 102 (#i) and 102 (#q) determine that the offset generation units 101 (#i) and 101 (#q) are not superimposing DC-offset components on the analog outputs from the DACs 702 (#i) and 702 (#q), respectively, the correction-value detection units 102 (#i) and 102 (#q) set up, for the offset generation units 101 (#i) and 101 (#q), operations of forcefully superimposing DC-offset components on the analog outputs from the DACs 702 (#i) and 702 (#q), respectively (step S205 when a determination result is NO in step S204).

In contrast, either, when the correction-value detection unit 102 (#i) determines that the offset generation unit 101 (#i) is superimposing a DC-offset component on the analog output from the DAC 702 (#i), the correction-value detection unit 102 (#i) cancels, for the offset generation unit 101 (#i), the operation of forcefully superimposing a DC-offset component on the analog output from the DAC 702 (#i), or, when the correction-value detection unit 102 (#q) determines that the offset generation unit 101 (#q) is superimposing a DC-offset component on the analog output from the DAC 702 (#q), the correction-value detection unit 102 (#q) cancels, for the offset generation unit 101 (#q), the operation of forcefully superimposing a DC-offset component on the analog output from the DAC 702 (#q). Alternatively, when the correction-value detection units 102 (#i) and 102 (#q) determine that the offset generation units 101 (#i) and 101 (#q) are superimposing DC-offset components on the analog outputs from the DACs 702 (#i) and 702 (#q), respectively, the correction-value detection units 102 (#i) and 102 (#q) cancel, for the offset generation units 101 (#i) and 101 (#q), the operations of forcefully superimposing DC-offset components on the analog outputs from the DACs 702 (#i) and 702 (#q), respectively (step S206 when a determination result is YES in step S204).

After the above-described operation is performed in step S205 or S206, the CPU 712 continues the process of calculating DC-offset correction values (step S201 after step S205 or S206).

Figure 1B:
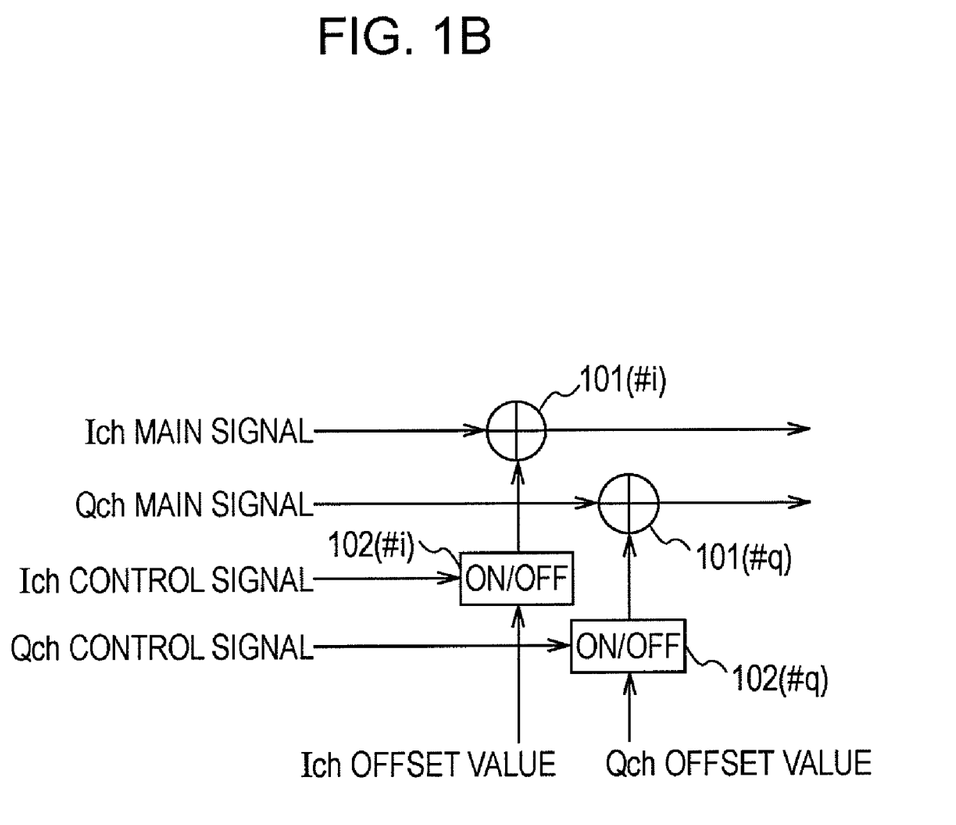

FIG. 1B is an example of a circuit diagram in a case in which portions associated with the offset generation units 101 (#i) and 101 (#q) are realized using hardware.

The offset generation units 101 (#i) and 101 (#q) are circuits that forcefully superimpose DC-offset components which are output from the correction-value detection units 102 (#i) and 102 (#q) on the analog outputs from the DACs 702 (#i) and 702 (#q), respectively. For example, the offset generation units 101 (#i) and 101 (#q) may be operational amplifier adders.

Figure 3:
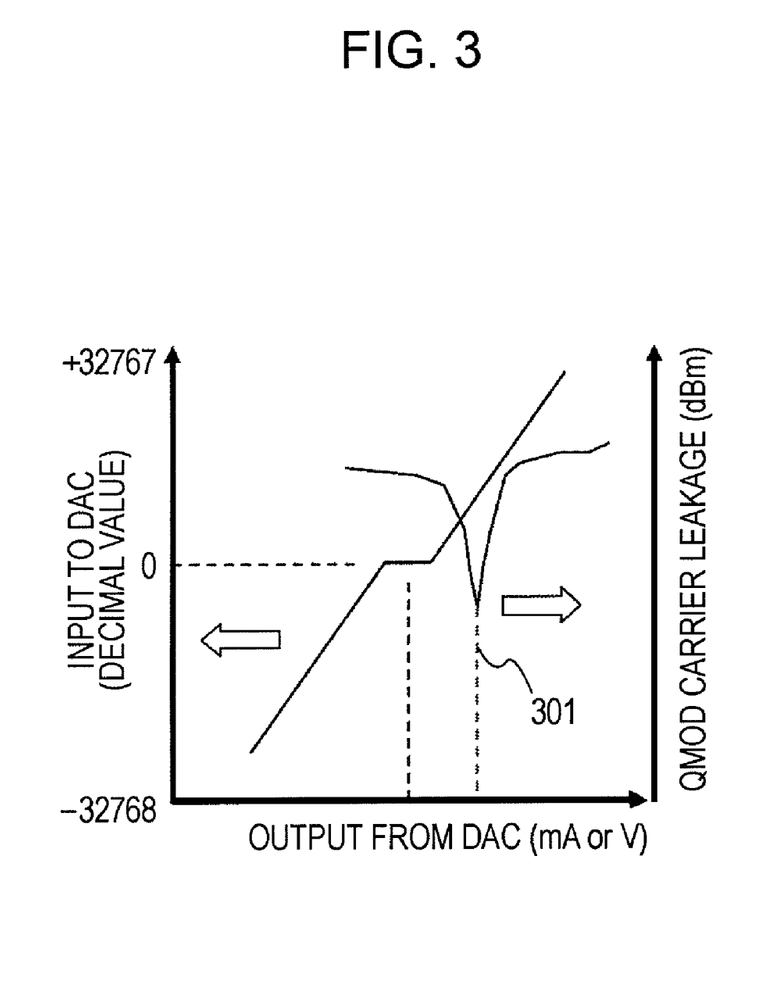
FIG. 3 is a graph illustrating the relative positional relationships between input-output characteristics of a DAC 702 (#i) or 702 (#q) and carrier-leakage characteristics in a MOD 703 or the like in the first embodiment.

FIG. 3 is a graph illustrating the relative positional relationships between input-output characteristics of the DAC 702 (#i) or 702 (#q) and carrier-leakage characteristics in the MOD 703 or the like in the first embodiment.

As can be understood by comparing FIG. 3 with FIG. 11, in the first embodiment, even when the DC-offset correction value on the input side of the DAC 702 (#i) or 702 (#q) becomes zero or a value close to zero, a DC-offset component is forcefully superimposed by the offset generation unit 101 (#i) or 101 (#q), which are disposed at the subsequent stages to the DACs 702 (#i) and 702 (#q), respectively. Accordingly, an optimum point 301 of the carrier-leakage characteristics shifts from a point at which a value that is input to the DAC 702 (#i) or 702 (#q) is zero or a value close to zero. Thus, an optimum carrier-leakage reducing process using the DC-offset correction values that are not zero or not values close to zero can be performed by the DC-offset correction units 701 (#i) and 701 (#q).

The DC-offset correction values (carrier leakage) change by a large amount in accordance with environmental conditions such as temperature. Accordingly, when the DC-offset correction values become zero or values close to zero again after DC-offset components have been generated and forcefully superimposed by the offset generation units 101 (#i) and 101 (#q), the process of generating and forcefully superimposing DC-offset components is stopped in accordance with the process of step S204 and the process of the following step S206 that are illustrated in FIG. 2. Thus, in the first embodiment, the DC-offset correction process that is also resistant to environmental variations can be performed.

Figure 4:
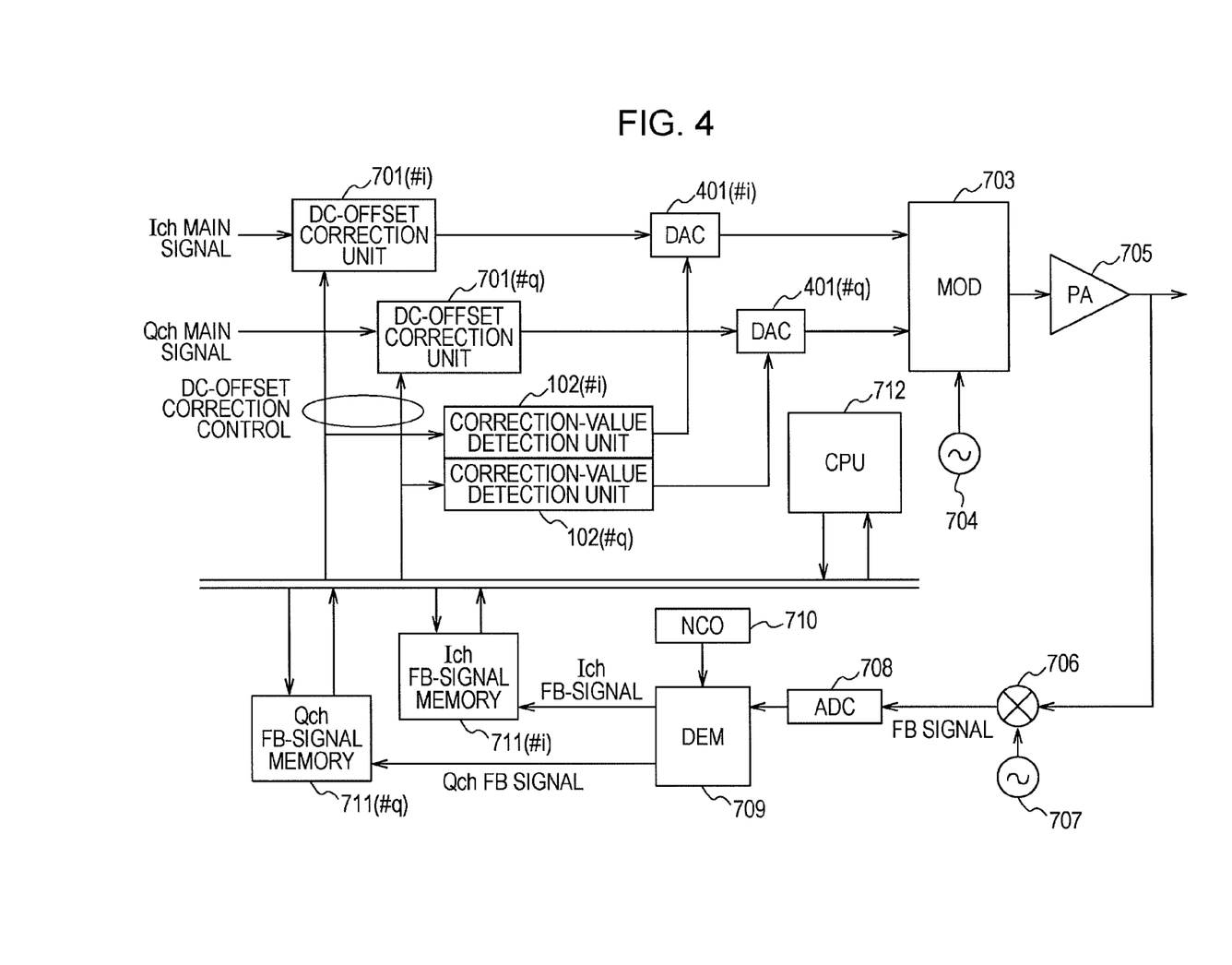
FIG. 4 is a diagram of a configuration of a second embodiment.

FIG. 4 is a diagram of a configuration of a second embodiment.

In the first embodiment illustrated in FIGS. 1A and 1B, DC-offset components are forcefully superimposed by the offset generation units 101 (#i) and 101 (#q), which are disposed at the subsequent stages to the DACs 702 (#i) and 702 (#q), on the basis of outputs from the correction-value detection units 102 (#i) and 102 (#q), respectively. In the second embodiment illustrated in FIG. 4, when DACs 401 (#i) and 401 (#q), with which the DACs 702 (#i) and 702 (#q) are replaced, respectively, are elements that perform an offset setting process, DC-offset components are directly superimposed by the DACs 401 (#i) and 401 (#q) on the basis of the outputs from the correction-value detection units 102 (#i) and 102 (#q), respectively. In this case, the number of circuit components can be reduced.

Figure 5:
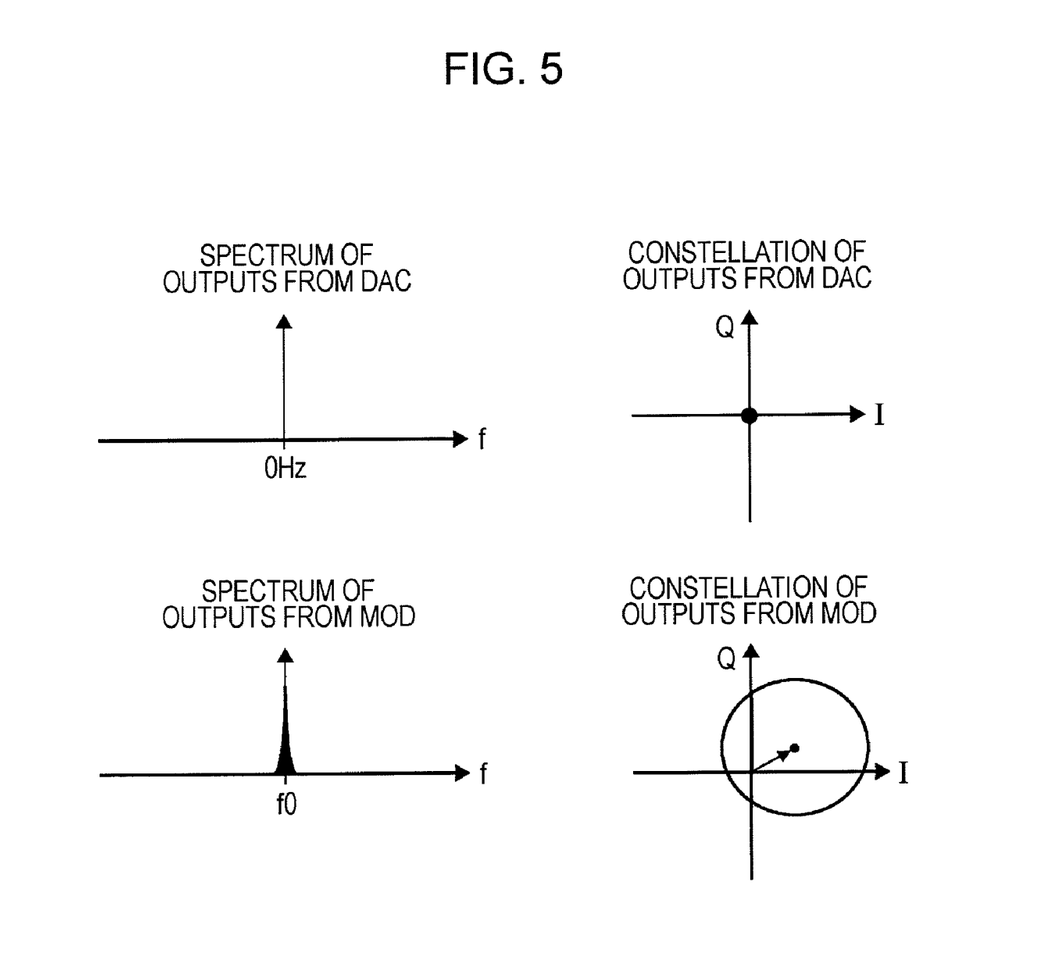
FIG. 5 includes diagrams illustrating a spectrum and constellation of outputs from each of DACs, and illustrating a spectrum and constellation of outputs from a MOD in a case in which a process of forcefully superimposing DC-offset components is not performed.
Figure 6:
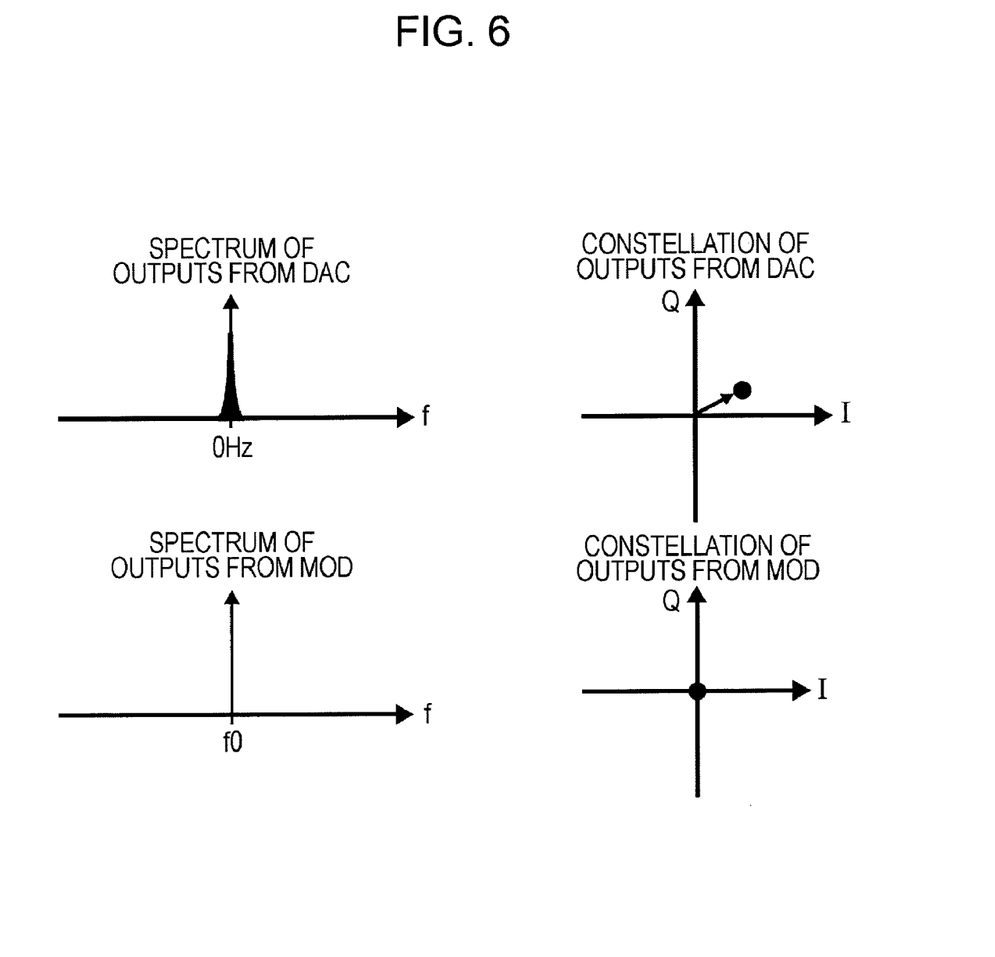
FIG. 6 includes diagrams illustrating a spectrum and constellation of outputs from each of the DACs, and illustrating a spectrum and constellation of outputs from the MOD in any one of the first and second embodiments.

FIG. 5 includes diagrams illustrating a spectrum and constellation of outputs from each of DACs, and illustrating a spectrum and constellation of outputs from a MOD when a DC-offset correction value becomes zero and a signal having an amplitude of zero is input to the DAC in a case in which the process of forcefully superimposing DC-offset components is not performed. FIG. 6 includes diagrams illustrating a spectrum and constellation of outputs from each of the DACs, and illustrating a spectrum and constellation of outputs from the MOD when a DC-offset correction value becomes zero and a signal having an amplitude of zero is input to the DAC in any one of the first and second embodiments in which the process of forcefully superimposing DC-offset components is performed.

As illustrated in FIG. 5, in a case in which the process of forcefully superimposing DC-offset components is not performed, when the outputs from the DAC become zero or values close to zero, the DC-offset correction process is substantially not performed. Accordingly, carrier leakage occurs in the outputs from the MOD, and phase shift occurs.

In contrast, as illustrated in FIG. 6, in any one of the first and second embodiments, when the outputs from the DAC become zero or values close to zero, DC-offset components are forcefully superimposed for each of the I and Q channels. Accordingly, it can be understood that carrier leakage is effectively reduced in the outputs from the MOD and that no phase shift occurs.

According to the above-disclosed technique, when an output from any one of the DACs becomes zero or a value close to zero, carrier leakage is effectively reduced in a quadrature modulation output, and occurrence of phase shift can be prevented.

Furthermore, the DC-offset correction values become zero or values close to zero again after DC-offset components are generated and forcefully superimposed, the DC-offset correction process that is also resistant to environmental variations such as temperature can be performed.

What is claimed is:

1. A direct-current-offset correction device comprising:
    a digital-to-analog converter that converts a digital signal into an analog signal;
    a modulator that modulates the analog signal to generate a modulated signal;
    a direct-current-offset correction value calculation unit that calculates a direct-current-offset correction value as a reverse characteristic component of a carrier leak occurring in the modulated signal based on a demodulated signal which is demodulated by feeding back the modulated signal;
    a direct-current-offset correction unit that corrects a direct-current-offset on the digital signal based on the direct-current-offset correction value;
    a correction value detection unit that detects whether or not the direct-current-offset correction value is zero or a neighboring value of zero; and
    an offset generation unit that superimposes a direct-current-offset component on the analog signal based on a detection result of the correction value detection unit.

2. The direct-current-offset correction device according to claim 1,
    wherein, in a case in which the offset generation unit is not superimposing the direct-current-offset component on the analog signal when the correction-value detection unit detects that the direct-current-offset correction value is zero or a value close to zero, the offset generation unit superimposes the direct-current-offset component on the analog signal, and
    wherein, in a case in which the offset generation unit is superimposing the direct-current-offset component on the analog signal when the correction-value detection unit detects that the direct-current-offset correction value is zero or a value close to zero, the offset generation unit cancels superimposing of the direct-current-offset component on the analog signal.

3. The direct-current-offset correction device according to claim 1, wherein the offset generation unit is an operational amplifier adder.

4. The direct-current-offset correction device according to claim 1, wherein the offset generation unit is realized using the digital-to-analog converter.

5. A direct-current-offset correction method comprising:
    converting a digital signal into an analog signal;

modulating the analog signal to generate a modulated signal;

calculating a direct-current correction value as a reverse characteristic component of a carrier leak occurring in the modulated signal based on a demodulated signal which is demodulated by feeding back the modulated signal;

correcting a direct-current-offset on the digital signal based on the direct-current-offset correction value;

detecting whether or not the direct-current-offset correction value is zero or a neighboring value of zero; and superimposing a direct-current-offset component on the analog signal based on a result of the detecting.

6. The direct-current-offset correction method according to claim 5, wherein, in a case in which the direct-current-offset component is not being superimposed on the analog signal when it is detected that the direct-current-offset correction value is zero or a value close to zero, the direct-current-offset component is superimposed on the analog signal, and wherein, in a case in which the direct-current-offset component is being superimposed on the analog signal when it is detected that the direct-current-offset correction value is zero or a value close to zero, superimposing of the direct-current-offset component on the analog signal is cancelled.

* * * * *